United States Patent [19]
Guo et al.

[11] Patent Number: 6,009,017
[45] Date of Patent: Dec. 28, 1999

[54] FLOATING GATE MEMORY WITH SUBSTRATE BAND-TO-BAND TUNNELING INDUCED HOT ELECTRON INJECTION

[75] Inventors: Jyh-Chyurn Guo, Chutung Hsinchu; W. J. Tsai, Hsinchu, both of Taiwan

[73] Assignee: Macronix International Co., Ltd., Hsinchu, Taiwan

[21] Appl. No.: 09/041,807

[22] Filed: Mar. 13, 1998

[51] Int. Cl.$^6$ ............................................. G11C 16/04
[52] U.S. Cl. ............................... 365/185.28; 365/185.18; 365/185.27
[58] Field of Search ................ 365/185.29, 185.28, 365/185.27, 185.14, 185.18; 327/315, 316, 323

[56] References Cited

U.S. PATENT DOCUMENTS

| | | | |
|---|---|---|---|
| 4,114,255 | 9/1978 | Salsbury et al. | 257/316 |
| 4,328,565 | 5/1982 | Harari | 365/185.29 |
| 5,156,990 | 10/1992 | Mitchell | 437/316 |
| 5,552,623 | 9/1996 | Nishizawa | 257/345 |
| 5,587,949 | 12/1996 | Bergemont et al. | 365/185.24 |
| 5,617,357 | 4/1997 | Haddad | 365/185.27 |
| 5,659,504 | 8/1997 | Bude et al. | 365/185.27 |
| 5,691,560 | 11/1997 | Sakakibara | 257/316 |
| 5,703,808 | 12/1997 | Makwana | 365/185.27 |
| 5,719,422 | 2/1998 | Burr et al. | 257/336 |
| 5,739,569 | 4/1998 | Chen | 257/321 |
| 5,780,893 | 7/1998 | Sugaya | 257/315 |
| 5,887,524 | 3/1999 | Oonakado et al. | 257/321 |

FOREIGN PATENT DOCUMENTS

| | | | |
|---|---|---|---|
| 0 399 261 | 11/1990 | European Pat. Off. | H01L 29/788 |
| 196 00 544 | 6/1995 | Germany | G11C 16/02 |

OTHER PUBLICATIONS

Chen I C et al.: "Band–To–Band Tunneling Induced Substrate Hot–Electron (BBISHE) Injection: A Ne'v Programming Mechanism For Nonvolatile Memory Devices." Dec. 3, 1989, pp. 263–266.

Patent Abstracts of Japan, vol. 18, No. 120 (E–1516). Feb. 25, 1994 & JP 05 315625 A Nov. 26, 1993.

Patent Abstracts of Japan, vol. 17, No. 672 (E–1474). Dec. 10, 1993 & JP 05 226665 A.

*Primary Examiner*—David Nelms
*Assistant Examiner*—Gene N. Auduong
*Attorney, Agent, or Firm*—Haynes & Beffel LLP

[57] ABSTRACT

A new flash memory cell structure and operational bias approach for allowing programming operations significantly faster than prior approaches, is based on the use of band-to-band tunneling induced hot electron injection in cells to be programmed and on the use of triple-well floating gate memory structures. The method comprises inducing band-to-band tunneling current from the semiconductor body to one of the source and drain near the channel, and applying a positive bias voltage to the control gate to induce hot electron injection into the floating gate. The other of the source and drain terminals is floated, that is disconnected so that current does not flow through that terminal. The band-to-band tunneling current is induced by applying a reference potential to one of the source and drain sufficient to establish conditions for the band-to-band tunneling current. For example, a reference potential of approximately 0 volts is applied to the drain, and negative bias of about −4 volts to −8 volts is applied to the semiconductor body, and a positive voltage is applied to the control gate which falls in a range of about +6 volts to about +10 volts.

15 Claims, 17 Drawing Sheets

FLOATING GATE MEMORY WITH SUBSTRATE BAND-TO-BAND TUNNELING INDUCED HOT ELECTRON INJECTION

BACKGROUND OF THE INVENTION

1. Field of the Invention

The present invention relates to nonvolatile memory devices, and more particularly to an improved nonvolatile memory based on floating gate transistors with fast programming.

2. Description of Related Art

Flash memory is a class of nonvolatile memory integrated circuits, based on floating gate transistors. The memory state of a floating gate cell is determined by the concentration of charge trapped in the floating gate. The operation of flash memory is largely dependent on the techniques used for injecting or removing charge from the floating gate.

Low power consumption, adaptability to low voltage operation as well as fast write and read constitute the desirable features for high density flash memory to be used as mass storage media in portable systems.

Much effort has been devoted to developing high density and high performance flash memory. However, there still remain some important aspects to be improved. Two of them are low voltage operation and high program/erase PGM/ERS cycling endurance. Flash memories generally use Fowler-Nordheim (FN) tunneling to inject and emit electrons through tunnel oxide. This means that a high electric field is required for flash memories to achieve high PGM/ERS speeds, and high voltages are needed at least inside the chip. Both high field and high voltage requirements go against low voltage operation and high PGM/ERS cycling endurance.

There are drawbacks associated with all of the various prior art program PGM operation schemes used to inject electrons into the floating gate. Channel Hot Electron Injection (CHEI) requires high current, high power, and causes a hot hole injection (HHI) issue for over-erased cells. Drain Avalanche Hot Carrier (DAHC) is low speed, and suffers a HHI induced reliability issue. Fowler-Nordheim (FN) tunneling suffers a speed/reliability trade-off. High speed leads to severe stress and reliability degradation due to the high fields. Channel FN tunneling suffers the disadvantage that substrate HHI cannot be avoided under increasing FN current. Edge FN tunneling suffers band-to-band tunneling BBT induced HHI which leads to critical reliability issues.

Accordingly, it is desirable to provide a flash memory cell design and operating technique which increases the speed and efficiency of programming of a floating gate memory array, in order to improve the overall performance of the device. Furthermore, it is desirable that the flash memory operating technique be suitable for low supply voltages.

SUMMARY OF THE INVENTION

The present invention provides a new flash memory cell structure and operational bias approach for allowing programming operations significantly faster and more efficient than prior approaches, based on the use of band-to-band tunneling induced hot electron injection BBTHEI in cells to be programmed, and in one embodiment on the use of triple-well floating gate memory structures.

Thus, the invention can be characterized as a method for programming floating gate memory cells, in which the cells are formed in a channel well within an isolation well in a semiconductor substrate. For example, in a p-type semiconductor substrate, a deep n-type isolation well is formed. Within the isolation well, a p-type channel well is formed. The floating gate memory cells are formed within the channel well, such that the channel areas of the cells reside in the channel well. The invention can also be applied in other semiconductor bodies which are capable of receiving a bias potential.

The method comprises inducing band-to-band tunneling current from the semiconductor body to one of the source and drain near the channel, and applying a positive bias voltage to the control gate to induce hot electron injection into the floating gate. The other of the source and drain terminals is floated, that is disconnected so that current does not flow through that terminal. The band-to-band tunneling current is induced by applying a reference potential to one of the source and drain sufficient relative to the negative bias voltage on the semiconductor body, to establish conditions for the band-to-band tunneling current. For example, a reference potential of approximately 0 volts is applied to the drain, a negative bias of about −4 volts to −8 volts is applied to the semiconductor body, and a positive voltage is applied to the control gate which falls in a range of about +6 volts to about +10 volts.

In a preferred example, the band-to-band tunneling current through the one of the source and drain which receives the reference potential falls in a range of about 1 to 10 nanoAmperes during the step of inducing band-to-band tunneling current, and the hot electron injection current induced is about 0.5 to 1% of the band-to-band tunneling current. The positive bias voltage applied to the control gate is ramped during an interval of about 5 to 100 microseconds from an initial level to final level. For one example, the control gate voltage is ramped from about 6.5 volts to about 10 volts, over a 10 microsecond interval.

The floating gate transistor according to the present invention comprises a semiconductor body having a first concentration of a first type of dopant, such as a channel well discussed above. A source is formed in the semiconductor body having a first concentration of a second type of dopant, and a drain is formed having a second concentration of the second type of dopant (which may be the same as, or different than, the source doping). A channel in the semiconductor body between the source and drain includes a concentration of the first type of dopant in a range of about $1\times10^{18}/cm^3$ or higher near a surface of the channel. Resources are included with the memory device to induce band-to-band tunneling current from the semiconductor body to one of the source and drain near the channel, and to apply a bias voltage to the control gate to induce hot electron injection into the floating gate as discussed above.

The increased concentration of dopant near the surface of the channel is utilized to enhance the band-to-band tunneling effect. Under the conditions described above, significant band-to-band tunneling current is found to occur when the doping concentration reaches a level on the order of $1\times10^{18}$ to $1\times10^{19}/cm^3$. Also, for MOS devices like floating gate transistors, where the gate electrode is located above the channel junction at one of the source and drain, band-to-band tunneling current is strongly effected by gate bias.

It is found that band-to-band tunneling current is enhanced by applying a shallow cell implant dose in a channel to enhance the doping concentration near the surface of the channel. Thus, according to one implementation of the present invention, the semiconductor body has a concentration of the first type of dopant that falls in a range of $1\times10^{18}/cm^3$ or higher within about 0.2 microns of the surface. This increased concentration of the first type of dopant is established by a shallow implant of dopants having concentration on the order of $10^{13}/cm^2$ at an energy between about 70 keV (kilo-electron Volts) and 40 keV, and about 50 keV in one example, in combination with a deeper implant of dopants having a concentration on the order of $10^{13}/cm^2$ at an energy of between about 100 keV and 150 keV, and about 125 keV in one example.

Thus, the present invention also provides a method for manufacturing a floating gate memory device adapted for band-to-band tunneling induced hot electron injection. The method comprises:

forming a semiconductor body having a first dopant type on and isolated from a semiconductor substrate;

implanting a second dopant type in source and drain regions in the semiconductor body;

implanting the first dopant type in the semiconductor body in a channel region between the source and drain regions so that concentration of the first type of dopants near a surface to the channel region is sufficient to enhance band-to-band tunneling current between the semiconductor body and one of the source and drain regions; and forming a tunnel dielectric over the channel region and a junction between one of the source and drain regions, a floating gate over the tunnel dielectric, a second dielectric over the floating gate, and a control gate over the second dielectric.

The semiconductor substrate comprises a doped semiconductor material of a first conductivity type, and the step of forming a semiconductor body in one preferred implementation comprises implanting a dopant of the second type relatively deeply to form a deep well of a second conductivity type in the substrate, and implanting a dopant of the first type to form a well of the first conductivity type in the deep well.

The step of implanting the first type of dopant in the semiconductor body within the channel region comprises implanting dopants of the first conductivity type with the concentration on the order of $10^{13}/cm^2$ at an energy between about 70 keV and 40 keV in the channel, and implanting dopants of the first conductivity type having a concentration on the order of $10^{13}/cm^2$ at an energy between about 100 keV and 150 keV.

Accordingly, a novel floating gate memory programming scheme has been provided which enables very low current and low power programming of the device. Programming current of less than 1 microAmp per byte can be realized utilizing the techniques of the present invention. In addition, a low gate bias induces less oxide stress during programming. With a gate bias of less than 10 volts, fast programming of about 10 to 15 microseconds per byte is achievable. Furthermore, there is a very high hot electron injection efficiency achieved. The gate current to drain current ratio of about 1 to 100 is achievable.

Other aspects and advantages of the present invention can be seen upon review of the figures, the detailed description and the claims which follow.

DETAILED DESCRIPTION

Figure 1:
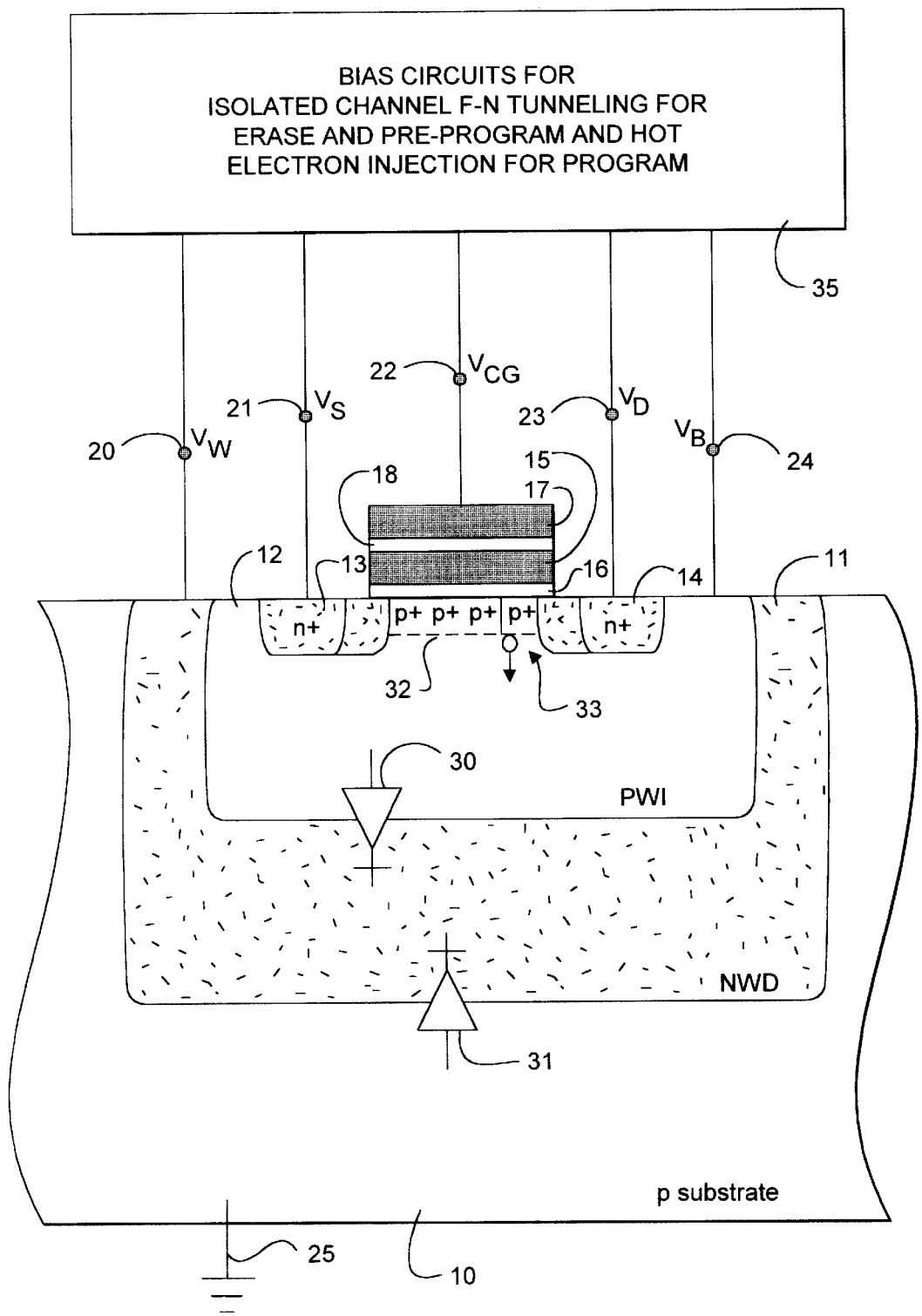
FIG. 1 is a cross section of a triple well flash memory cell according to the present invention.

A detailed description of preferred embodiments of the present invention is provided with respect to the figures, in which FIG. 1 illustrates the basic structure of the triple well floating gate memory cell according to the present invention. As shown in FIG. 1, a semiconductor substrate 10 has a first conductivity type. Preferably, the substrate 10 is silicon with a p-type doping. A deep n-type well NWD 11 is formed in the substrate 10. Inside the deep n-type well 11, a p-type well PWI 12 is included. An n-type source 13 and an n-type drain 14 are included inside the p-type well 12. A floating gate structure, including a floating gate 15 and a tunnel insulator 16, is formed over a channel area between the source 13 and drain 14. A control gate structure, including a control gate 17 and inter-poly insulator 18, is formed over the floating gate 15.

The deep n-type well 11 acts as an isolation well for the device. The p-type well 12 provides a channel well acting as a semiconductor body for the cell. The n-type source and drain structures are formed within the p-type well 12, establishing a channel in the p-type well isolated from the substrate 10 by the isolation well 11.

In FIG. 1, bias points 20 through 24 are illustrated for the structure. The bias point 20 is coupled to the deep n-type well 11 which is used for isolation. The contact point 21 is coupled to the source terminal 13. The contact 22 is coupled to the control gate of the cell. The contact 23 is coupled to the drain region 14. The contact 24 is coupled to the channel well 12. These terminals are biased in order to achieve programming, pre-programming, and erasing.

Thus, the flash memory cell is fabricated using a triple-well CMOS process. The thicknesses of tunnel oxide and inter-poly dielectric are for example 100A and 160A, respectively. The cell is formed in p-well with surrounding deep n-well. Dual channel implants are performed: one of them is named shallow cell implant with smaller implant energy around 50 keV, and the other named deep cell implant with higher implant energy beyond 100 keV. The implant species is p-type, preferably boron, for both shallow and deep cell implants. This results in a region schematically represented by the "p+" symbols outlined by dashed line 32, of higher concentration of p-type dopant near the surface of the channel, such as about $1 \times 10^{18}/cm^3$ or greater, to enhance BBT current and the generation of electron/hole pairs 33 to feed the HEI.

The major features of one example flash cell according to the present invention are (1) triple well is created by firstly N-well formation with $p^{31}$ implant and the subsequent high temperature and long time drive-in (or anneal) (2) dual cell implants are performed by $B^{11}$ implant with dual energies and dual doses, denoted as shallow cell implant (energy~50 keV) and deep cell implant (energy~100 keV). The respective purpose is cell $V_T$ adjustment and enhanced BBT conditions realized by shallow cell implant and anti-punch through achieved by deep cell implant (3) buried source/drain (S/D) are formed by S/D implant with heavy dose $As^{75}$ and following the thermal budget with wet oxidation process. Due to the mechanism of dopant-enhance-oxidation, a field-oxide-like regions are formed over the source and drain (buried-source-oxide bsox or buried-drain-oxide bdox).

Band-to-band tunneling (BBT) becomes significant in this structure when the channel doping concentration reaches a certain level in the order of around $1 \times 10^{18}$ to $1 \times 10^{19}$ cm$^{-3}$. As for MOS devices with gate electrode located above the channel-to-S/D junction, the BBT is strongly affected by the gate bias. In this work, it is evidenced that BBT can be enhanced by increasing shallow cell implant dose.

Figure 2:
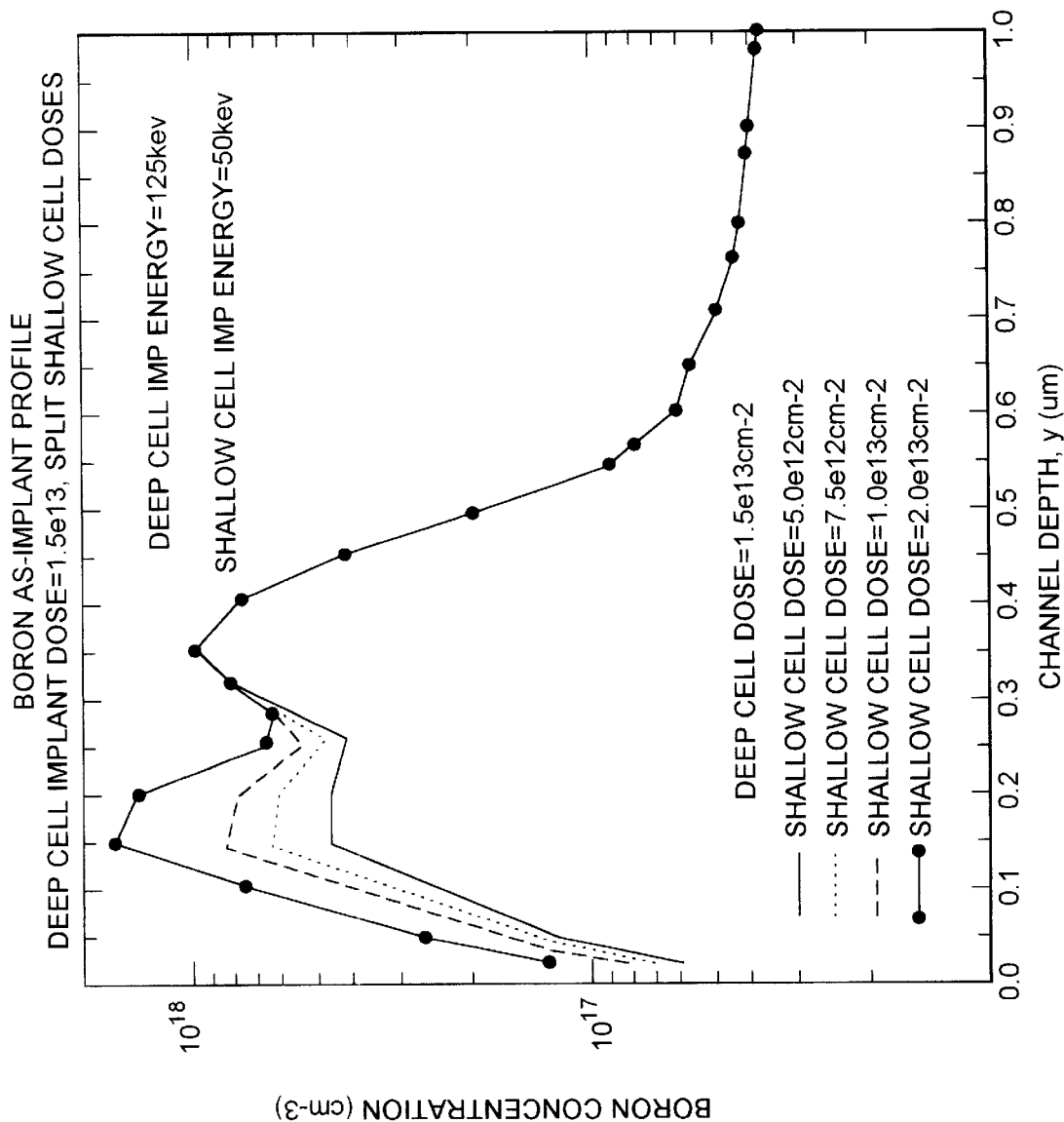
FIG. 2 illustrates the boron as implanted profile for a cell manufactured according to the present invention with various shallow implant dosages.
Figure 3:
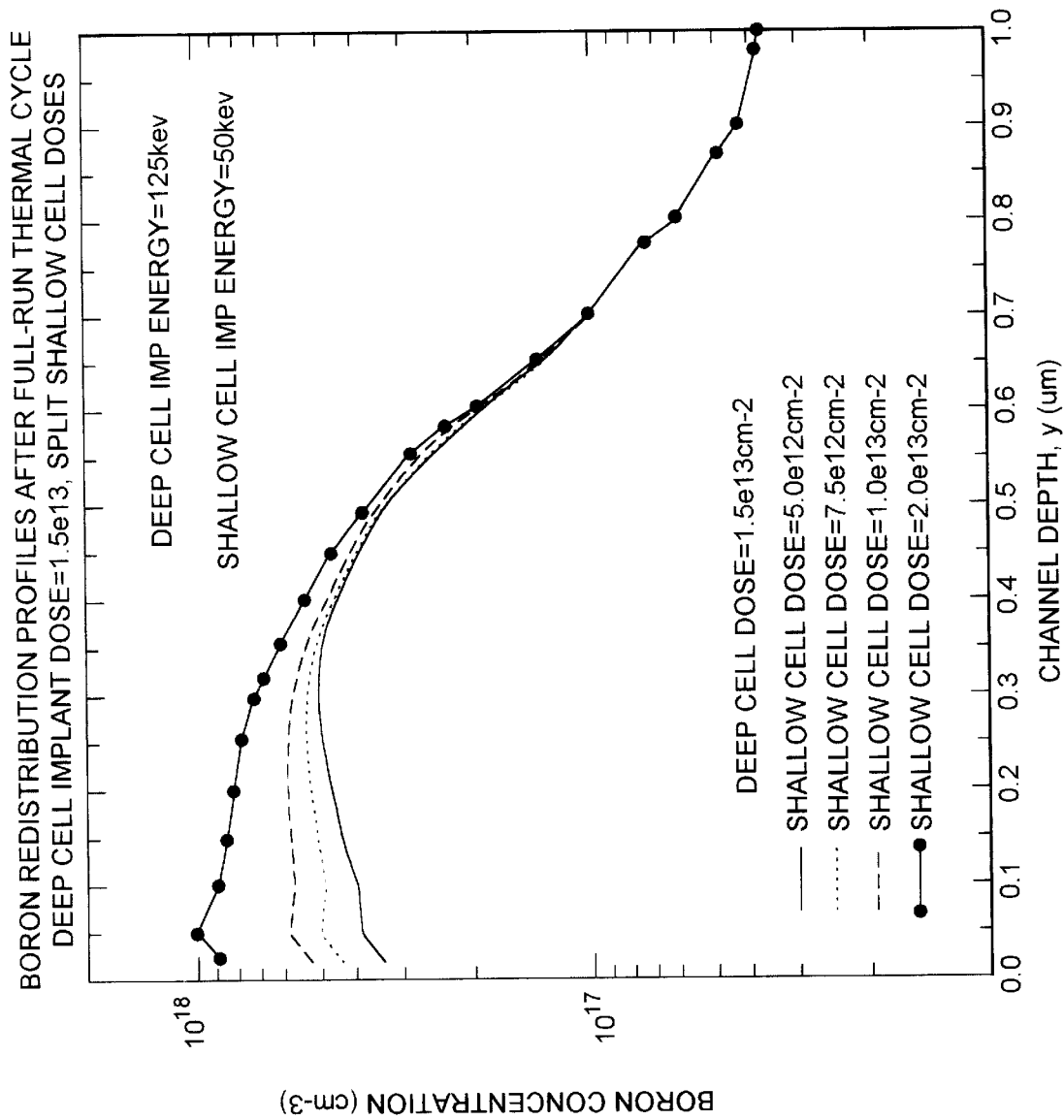
FIG. 3 is a graph illustrating the boron redistribution profiles after the full run thermal cycle of a cell manufactured according to the present invention.

FIG. 2 illustrates the boron as-implanted profiles associated with split dual-cell implants (as-implanted profile means the profile formed in the instant of ion-implantation and without going through any thermal budget). In this simulation, the deep implant condition is fixed at 125 keV and $1.5 \times 10^{13}$cm$^{-2}$ while the several shallow cell implant doses are charted at $5 \times 10^{12}$, $7.5 \times 10^{12}$, $1.0 \times 10^{13}$, and $2.0 \times 10^{13}$cm$^{-2}$ respectively. These one-dimensional plots are cut along the central channel region, from Si surface to bulk. As for the eventual profiles produced after complete thermal budget, a complicated diffusion model is used to calculate the boron redistribution subject to the extensive thermal cycles (tunnel oxide growth, bsox growth, cell-reoxidation, poly-dopant-drive-in, gate oxidation, Source/Drain implant annealing, etc.). The simulation results shown in FIG. 3 demonstrate clearly that the mentioned full-run thermal cycles lead to boron redistribution from bulk to surface:

boron surface concentration is significantly enhanced when we compare FIG. 2 and FIG. 3. As mentioned previously, BBT becomes significant when the doping concentration reaches a certain level of the order of $1 \times 10^{18}$ to $1 \times 10^{19}$cm$^{-3}$. Adequate shallow cell implant dose to reach the required doping concentration level of about $1 \times 10^{18}$cm$^3$ within about 0.2 microns of the surface, of no less than $2.0e^{13}$cm$^{-2}$ for this example is shown in FIG. 3.

Also shown in FIG. 1 are diode symbols 30 and 31, representing respectively the P-N junction between the channel well PWl 12 and the isolation well NWD 11, and the P-N junction between the substrate 10 and the isolation well. As long as the substrate 10 is biased at a level near or less than the isolation well 11, the P-N junction represented by diode symbol 31 is non-conducting. Also, as long as the channel well 12 is biased near or below the isolation well, the P-N junction represented by diode symbol 30 is non-conducting.

Bias circuits 35 apply potentials to the terminals 20 through 24 for band-to-band tunneling induced hot electron injection as described below.

The programming bias for u-type devices in a p-type substrate 10 coupled to ground 25, is shown in TABLE 1 for one example as follows:

TABLE 1

| PROGRAM | |
|---|---|
| Drain, $V_D$ | Ground |
| Source, $V_S$ | Float |
| p-type Channel Well, $V_B$ | Negative Voltage (e.g. −4 to −8) |
| Wordline, $V_{CG}$ | Ramped Positive Voltage (e.g. 6.5 to 10) |
| n-type Isolation Well, $V_W$ | VDD |

For comparison, TABLE 2 shows the bias condition for prior art programming techniques in n-type devices and for BBT-HEI according to the present invention.

| | Bias | | | | |
|---|---|---|---|---|---|
| Schemes | $V_D$ | $V_S$ | $V_B$ | $V_{CG}$ | Note |
| CHEI | + | Gnd | Gnd | + | $V_G - V_T \sim V_D$ |
| DAHC | + | Gnd | Gnd | + | $V_G - V_T \ll V_D$ |
| Channel-FN | Gnd | Gnd | Gnd (−) | + | $\epsilon_{ox} > \sim 10$ Mv/cm |
| Edge-FN | Gnd (−) | Gnd (−) | Floated | + | $\epsilon_{ox} > \sim 10$ Mv/cm |
| BBT-HEI | Gnd | Floated | − | + | $\epsilon_{ox} < 7$ Mv/cm |

($V_T$ is the cell threshold voltage.)

The magnitude of electric field across the tunnel oxide denoted as $\epsilon_{ox}$ in the TABLE 2 is specified corresponding to a certain PGM speed. For channel-FN and/or edge-FN, $\epsilon_{ox}$ of no less than 10 Mv/cm (MegaVolts per centimeter) is required to keep the PGM time in the order of 1~10 ms (milliseconds). As for CHEI, very short PGM time in the order of 10 us (microseconds) can be attained with $\epsilon_{ox}$ no larger than 5 Mv/cm. However, the power consumption and loading effect originating from the large channel conduction current becomes a bottleneck for CHEI to get into low power application. DAHC is generally used for soft-PGM rather than PGM due to substantially smaller gate current in comparison with CHEI. The advantage offered by DAHC is the reduction of channel conduction current, that is beneficial to large-sector-size soft-PGM; however, hot-hole-injection (HHI) cannot be avoided during DAHC and HHI will lead to cell reliability degradation.

Figure 4:
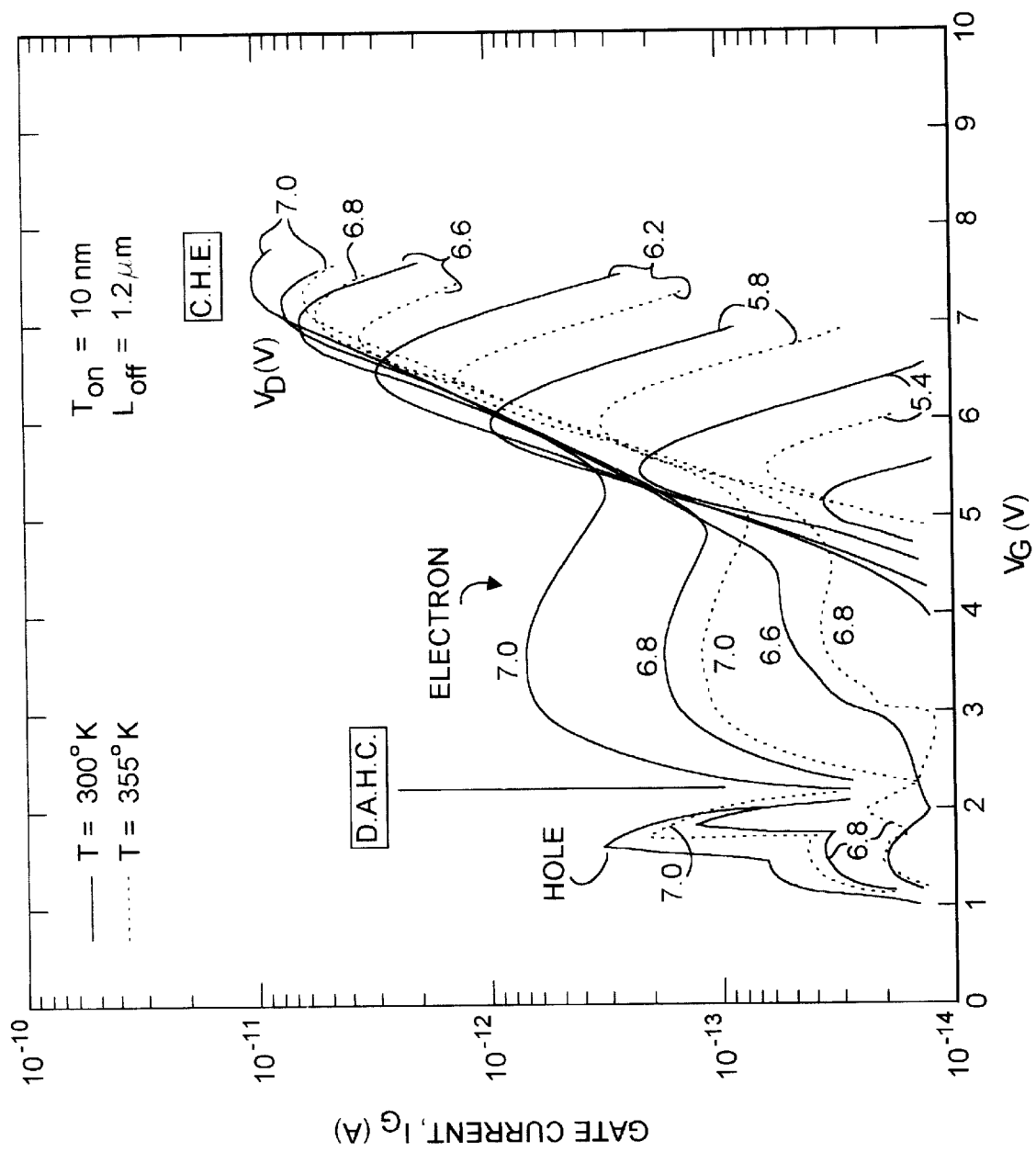
FIG. 4 is a graph illustrating the gate current versus gate voltage characteristics of channel hot electron injection (CHEI) techniques and drain avalanche hot carrier (DAHC) techniques used for programming in prior art devices.
Figure 5:
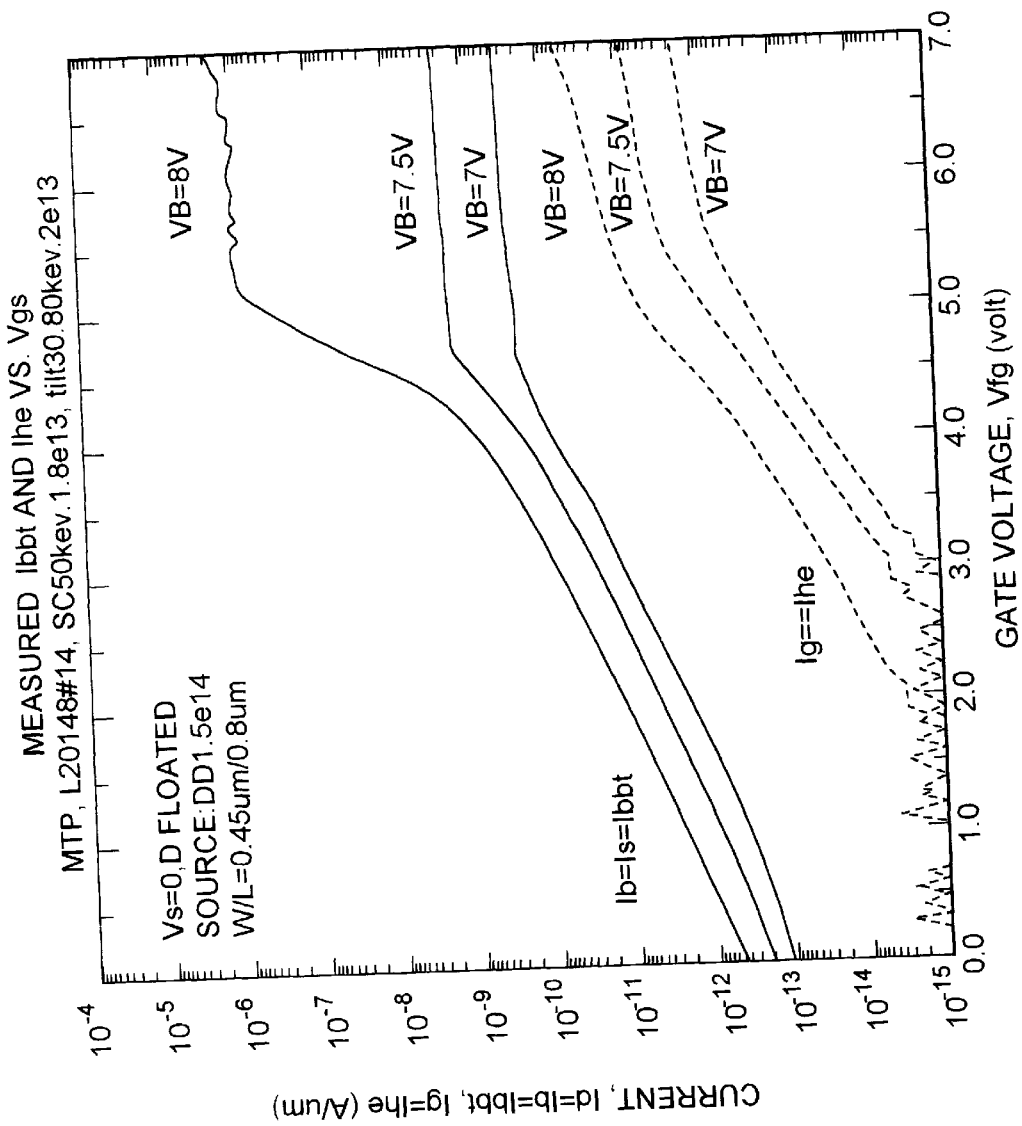
FIG. 5 is a graph illustrating the measured band-to-band tunneling current and the hot electron current versus gate voltage for a device according to the present invention, illustrating high gate current injection efficiency.

FIG. 4 illustrates gate current $I_G$ vs. gate voltage $V_G$ characteristics corresponding to CHEI and DAHC at drain voltage of 6.6 volts to 7 volts for CHEI, and of 5.4 to 7.0 volts for DAHC, and for two temperatures. These approaches in due relatively high drain currents. In the present invention, substrate BBT induced HEI provides substantially enhanced gate-current injection efficiency in the order of around $10^{-2}$ as shown in FIG. 5. Large gate current is delivered with small substrate current; that is beneficial to high speed and low power application.

Figure 6:
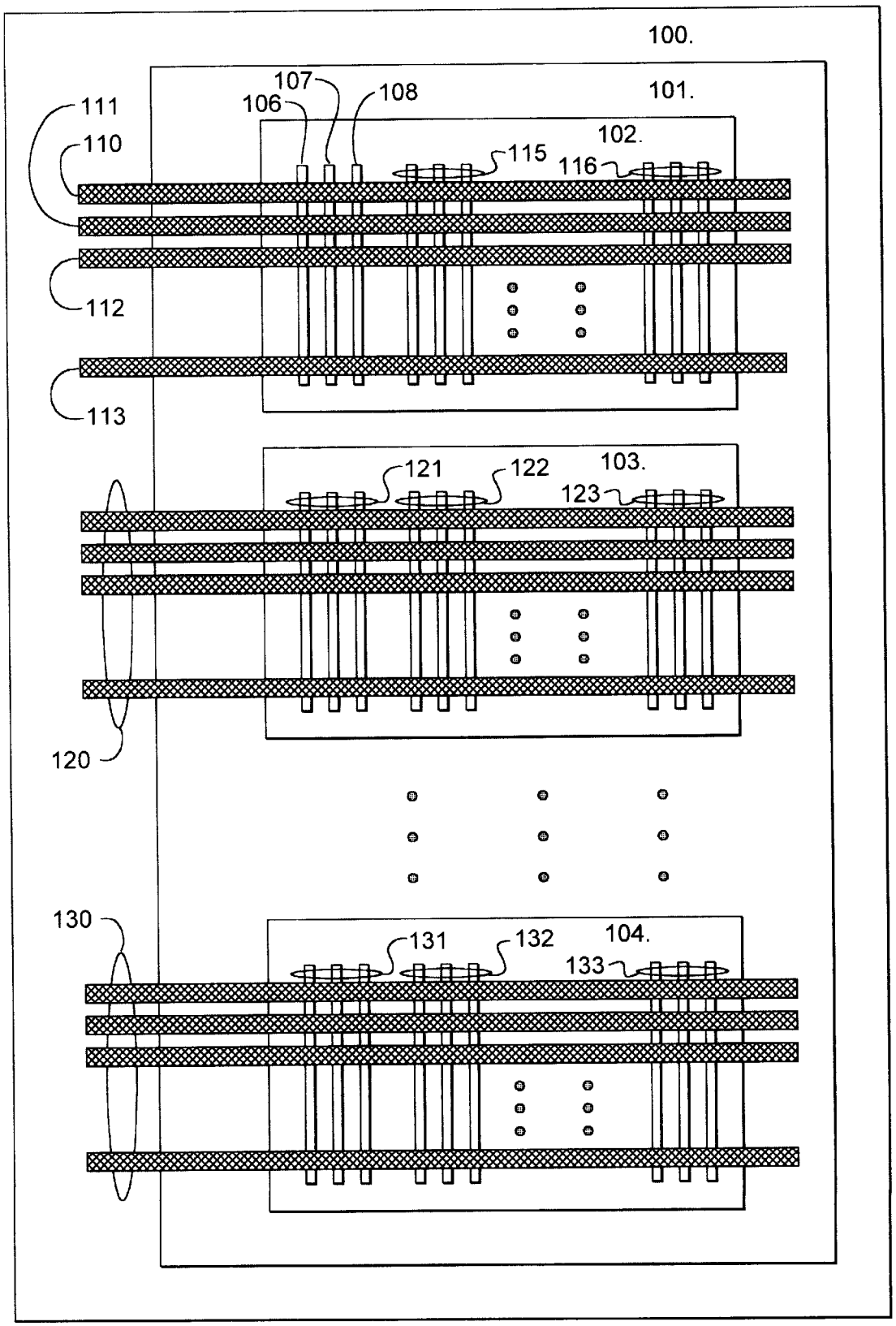
FIG. 6 is a simplified layout for a flash memory device including a plurality of channel wells and memory cell arrays according to the present invention.
Figure 7:
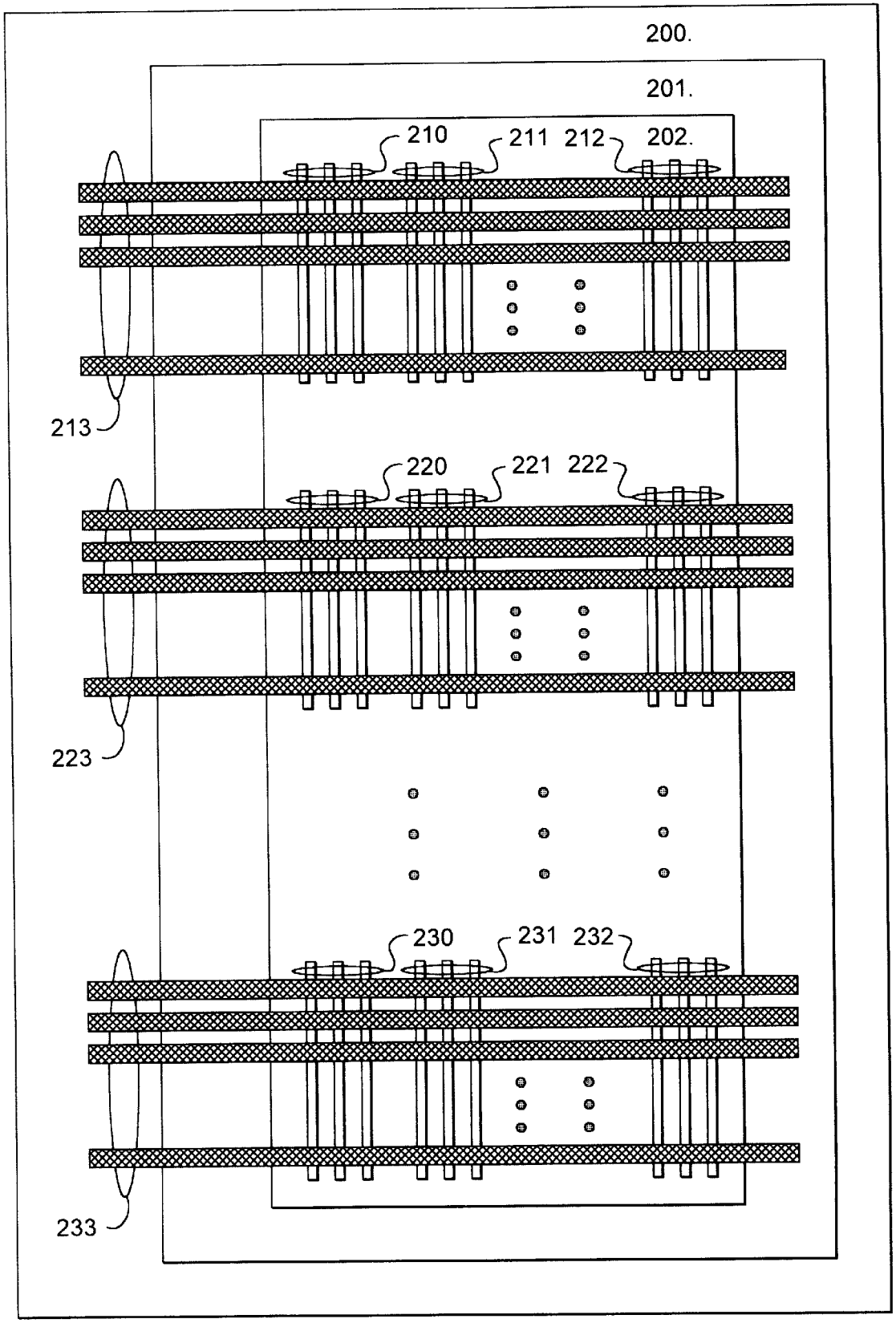
FIG. 7 is a simplified layout diagram for a flash memory device with a single channel well.

Two basic architectures are shown in FIG. 6 and FIG. 7 for laying out the isolation well and channel well according to the present invention. FIG. 6 illustrates an embodiment in which there are a plurality of channel wells along with a corresponding plurality of separate arrays of floating gate memory cells. In FIG. 6, the semiconductor substrate is represented by the outer box 100. The isolation well is shaded box 101. The channel wells in the figure include channel well 102, channel well 103 and channel well 104. As represented in the figure, there may be a number of channel wells with corresponding arrays of floating gate memory cells in each one. The arrays of floating gate memory cells in the device of FIG. 6 are illustrated in a simplified format, with the drain and source diffusion regions and wordlines shown. The global bit lines, block select circuitry, and other circuits necessary for completing the structure and not illustrated in the figure, are well understood by persons of skill in the art. For instance, this architecture can be implemented as described in U.S. Pat. No. 5,399,891, U.S. Pat. No. 5,414,664, or U.S. Pat. No. 5,526,307, all of which are incorporated by reference as if fully set forth herein. Although the drain-source-drain structure of FIGS. 6 and 7 are presently preferred, other architectures are suitable, such as a virtual ground architecture with continuous arrays.

In this example, a plurality of drain-source-drain structures are shown in channel well 102, in which a drain diffusion 106, a source diffusion 107 and a drain diffusion 108 define two columns of cells, and in which wordlines 110, 111, 112, 113 intersect the drain diffusion 106, source diffusion 107, and drain diffusion 108 over memory cells. Within the channel well 102, additional drain-source-drain structures 115, 116 are included to provide an array within the channel well 102. As illustrated in the figure by the shading, the isolation well 101, the drain diffusion regions 106 and 108, and the source diffusion regions 107, all have the same conductivity type, preferably n-type. The substrate 100 and the channel region 102 are both of the same conductivity type, preferably p-type.

The arrays in other channel wells 103 and 104 are configured with a similar structure. Thus, a plurality of wordlines 120 is included for channel well 103. Drain-source-drain structures 121, 122, 123 within channel well 103 intersected by the wordlines 120 form the array of flash memory cells.

In a similar fashion the channel well 104 includes an array of flash memory cells composed of the wordlines 130, and the drain-source-drain structures 131, 132 and 133.

This architecture is suitable for systems in which it is desirable to erase arrays having a block size equal to that of the channel well, such as the channel well 103. The channel wells can be individually biased to avoid disturbance of unselected cells, and to reduce stress on peripheral devices outside of the array on the substrate.

For a smaller array size, and a small overall integrated circuit size, the architecture of FIG. 7 is suitable. According to the architecture FIG. 7, substrate 200 has a first conductivity type, such as p-type. An isolation well 201 has a second conductivity type, preferably n-type. A channel well 202 is formed within the isolation well 201, having a conductivity type which is the same as that of the substrate. A plurality of blocks of floating gate memory cells is formed within the channel well 202 to produce a large array. Thus, a first block includes a set of drain-source-drain structures 210, 211, 212 and a set of wordlines 213. The individual flash memory cells reside between the source and drain diffusions and underneath the wordlines in the array. A second block of cells is based on drain-source-drain structures 220, 221 and 222 with wordlines 223. A third set of cells is based on drain-source-drain structures 230, 231 and 232, with wordlines 233.

Figure 8:
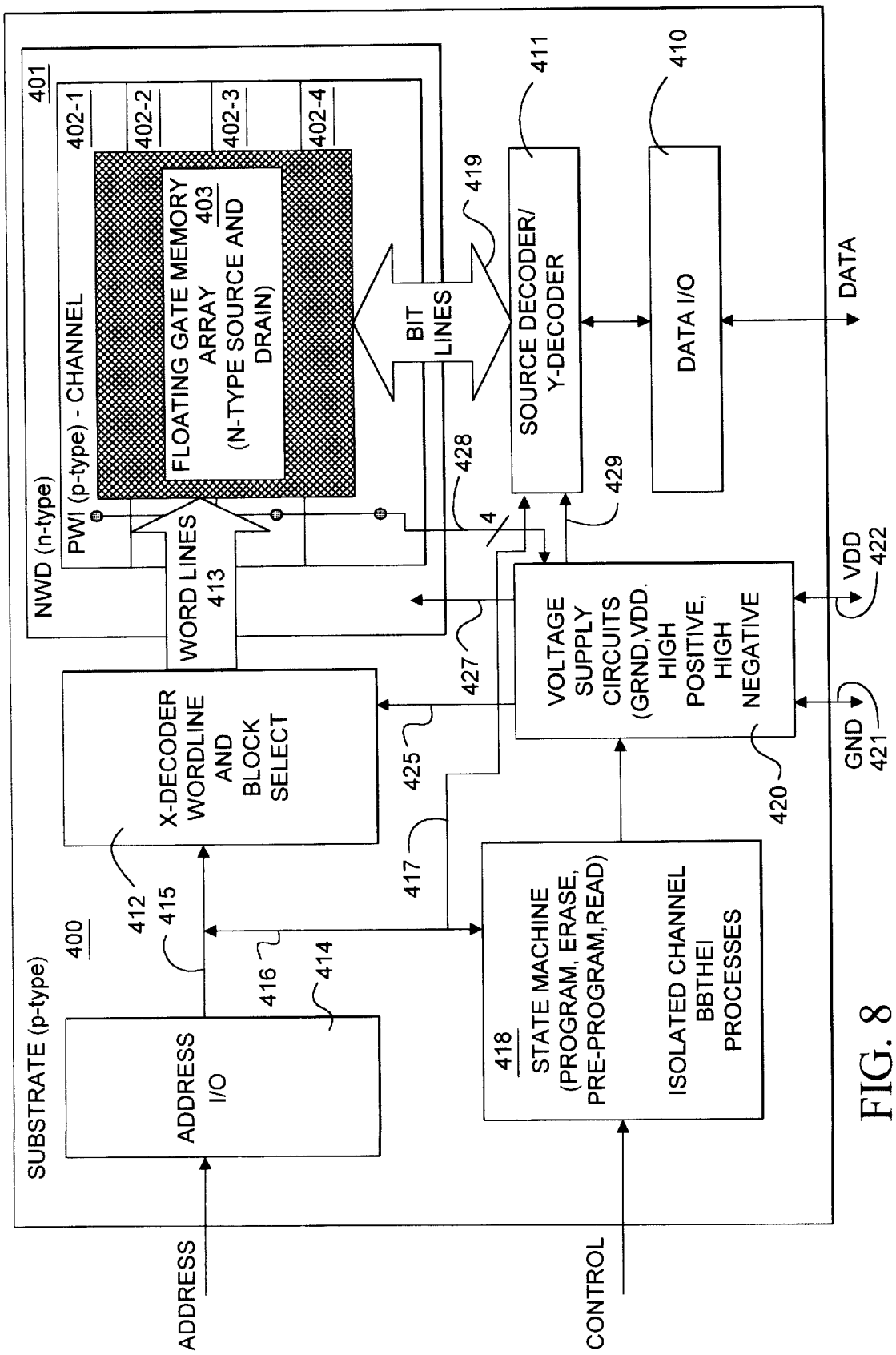
FIG. 8 is a simplified block diagram of a flash memory integrated circuit according to the present invention.

FIG. 8 provides a simplified diagram of an integrated circuit memory device including the floating gate memory array using the triple well architecture of the present invention. Thus, a semiconductor substrate 400 includes an isolation well 401 and a set of channel wells 402-1, 402-2, 402-3 and 402-4 for an array 403 of floating gate memory cells. In the preferred embodiment, the substrate 400 is p-type. The isolation well 401 is n-type. The channel wells 402-1 to 402-4 are p-type, and the source and drain regions of the cells in the floating gate memory array 403 are n-type.

The architecture of the array may be implemented according to that of FIG. 6 or that of FIG. 7, depending on a particular use for which the device is designed. In FIG. 8, the architecture of FIG. 6 is shown with channel wells 402-1, 402-2, 402-3 and 402-4.

Peripheral circuitry on the substrate 400 is coupled with the array 403. The peripheral circuitry includes control state machine 418, including logic to control and execute the band-to-band tunneling induced hot electron injection as programming, as well as erase and read operations. The data input/output logic 410 is coupled to a source decoder/Y decoder 411. The source decoder/Y decoder 411 is coupled to the bit lines 419 and source lines (not shown) of the array 403, providing access to the array for reading and programming.

Also the peripheral circuitry includes an X decoder 412 which includes wordline and block select drivers for the array 403. The X decoder 412 is coupled to the wordlines 413 and other control lines for accessing rows and blocks of cells in the floating gate memory array 403. Address input/output (I/O) logic 414 is coupled to the X decoder 412, and to the Y decoder 411 across line 415, line 416 and line 417. Also, the address I/O logic 414 is coupled to state machine 418.

The substrate 400 also includes voltage supply circuits 420. The voltage supply circuits are coupled to an external ground on line 421 and to an external supply voltage VDD on line 422. The external supply voltage VDD may range from about 2 volts, or lower, to about 5 volts in preferred systems. The voltage supply circuits 420 are used to supply ground, VDD, high positive, and high negative to the isolation well 401, the channel well 402, the source and drain regions in the array 403 and the wordlines 413 in order to achieve the bias conditions discussed above for the triple well architecture.

Thus, the voltage supply circuits 420 include voltage dividers, charge pumps, and other circuitry which is utilized to generate bias voltages to drive the program, erase, pre-program and read operations of the memory device. Thus, as illustrated in FIG. 8, the voltage supply circuits 420 are coupled to the X decoder 412 on line 425 for controlling the bias level on the control gates of cells in the array across the wordlines 413. Also the voltage supply circuits 420 are coupled to the source decoder/Y decoder 411 on line 429 for controlling the bias on the source and drain terminals of the cells through the bit lines 419. In alternative systems, the source potential may be applied, and the sources may be floated, through special source bias lines independent of the bit lines.

The voltage supply circuits 420 are connected to the isolation well 401 on line 427. The voltage supply circuits 420 are connected to the plurality of channel wells 402-1 through 402-4 on supply lines 428, one for each channel well which are individually controllable. The state machine 418 controls the supply circuits to bias the selected channel wells, the isolation well and other terminals appropriately.

As illustrated in the figure, the p-type channel well is implemented in 6 units 402-1 through 402-4 according to the architecture of FIG. 6. An alternative system includes the architecture of FIG. 7 in which a single bias line is needed for the channel well.

Figure 9:
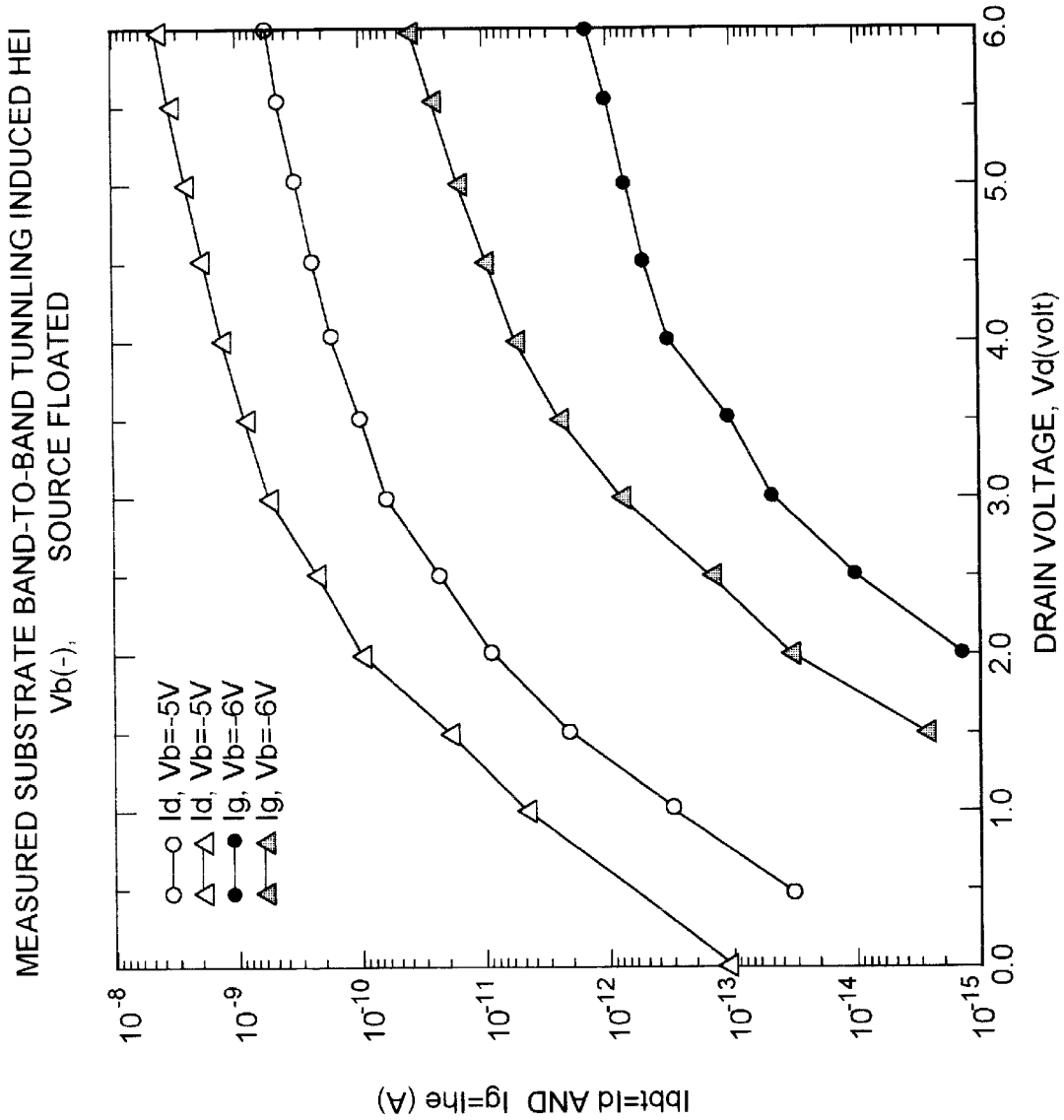
FIG. 9 is a graph illustrating the measured substrate band-to-band tunneling induced hot electron injection, with negative substrate bias.

FIG. 9 illustrates $I_D$ and $I_G$ versus $V_D$ measured for a 16M flash cell device. The bias condition is with source floated, and with negative biases applied to the substrate ($V_B$=−5, −6v). An extremely high gate current injection ratio of about $10^{-2}$ is achieved. It is clearly illustrated in FIG. 9 that $I_G$ of about 50pA is obtained with very small drain current ($I_D$) of 5 nA.

FIG. 1 illustrates a stack-gate n-channel flash cell device and the proposed new bias scheme for low current, high speed PGM. Simulation is performed based on the built device structure and the proposed bias scheme.

Figure 10A:
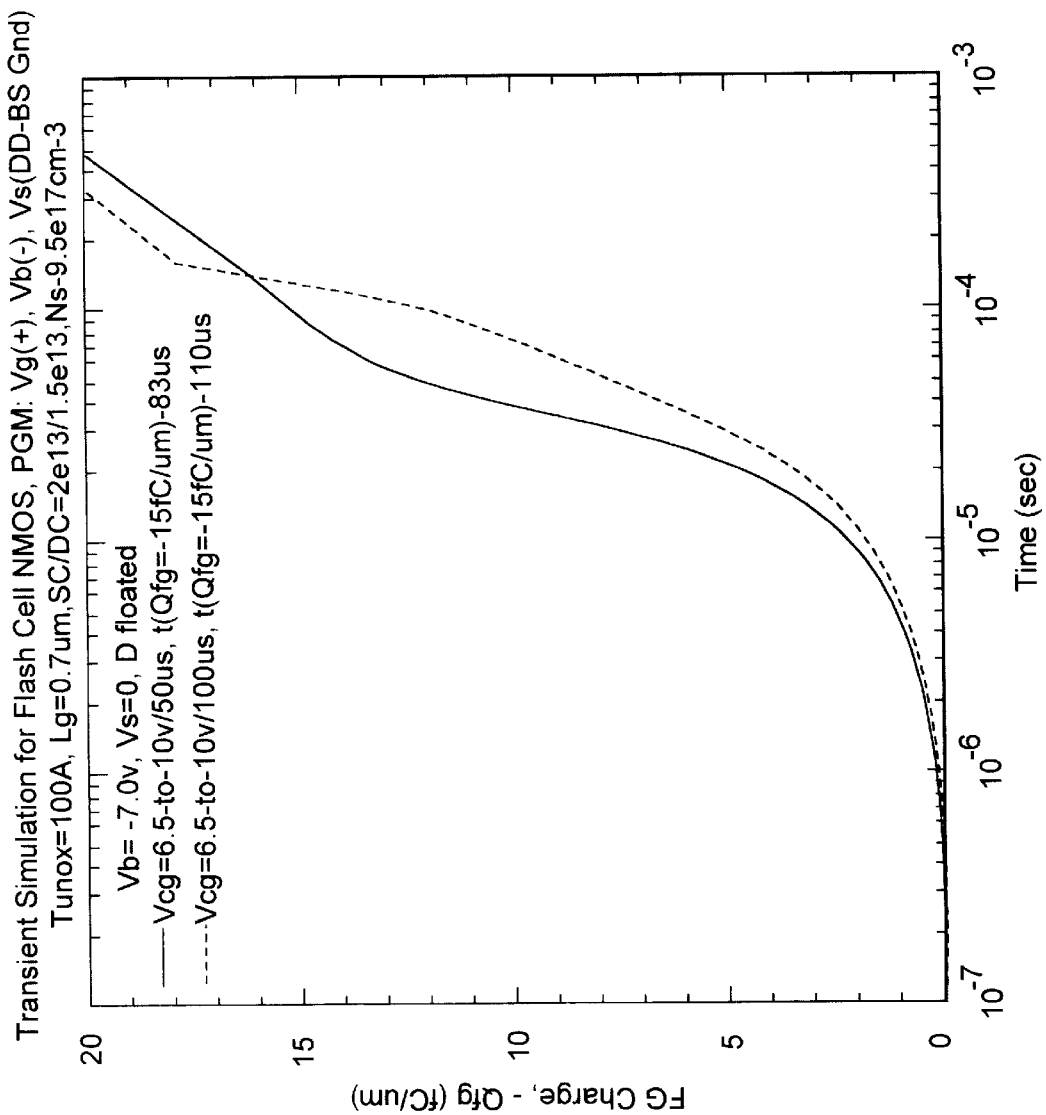
FIG. 10A is a graph of the floating gate charge versus time simulation for a flash cell with substrate bias of −7 volts and control gate voltage ramping interval of 50 microseconds and a ramping interval of 100 microseconds.
Figure 10B:
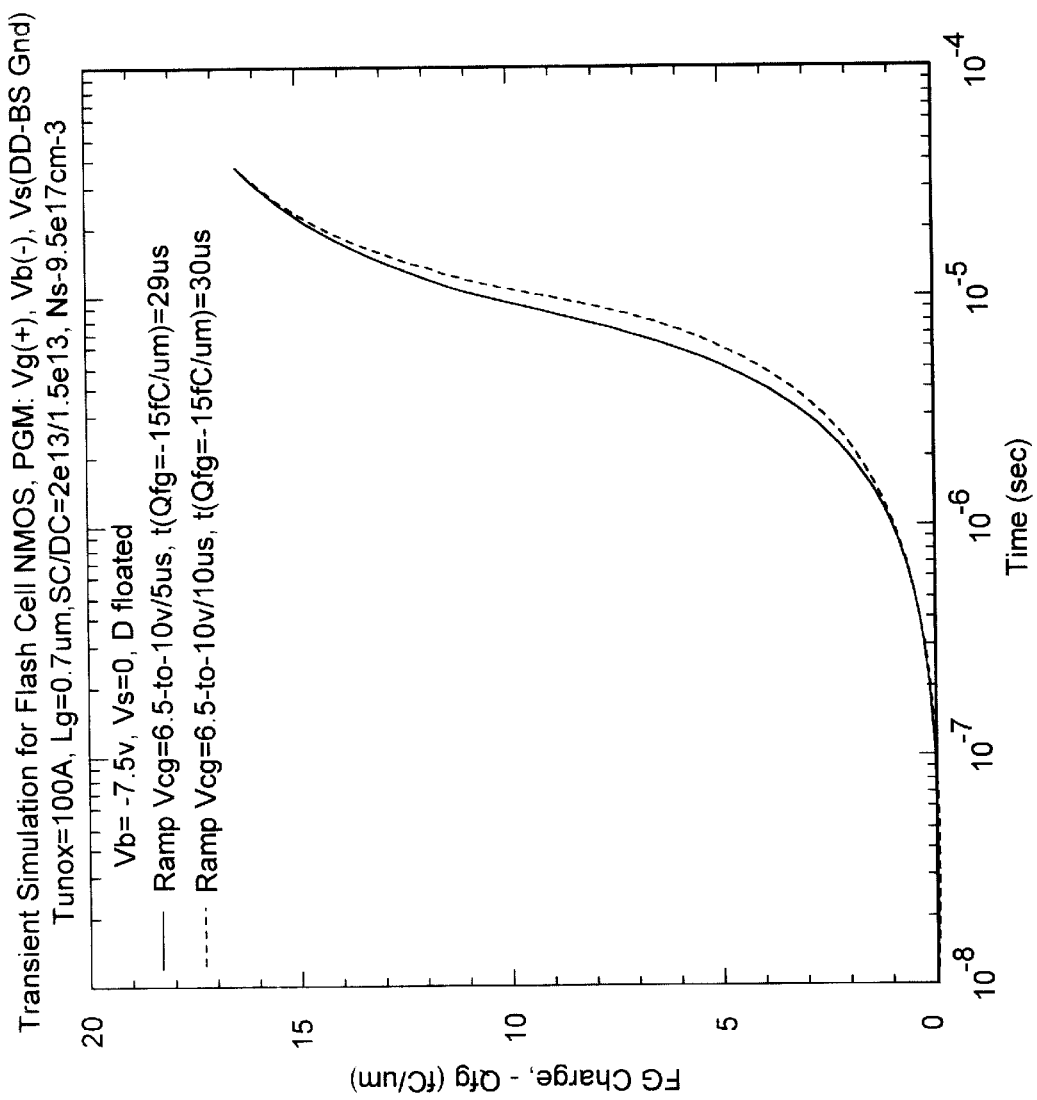
FIG. 10B is a graph of the floating gate charge versus time simulation for a flash cell with substrate bias of −7.5 volts and control gate voltage ramping interval of 5 microseconds and a ramping interval of 10 microseconds.
Figure 10C:
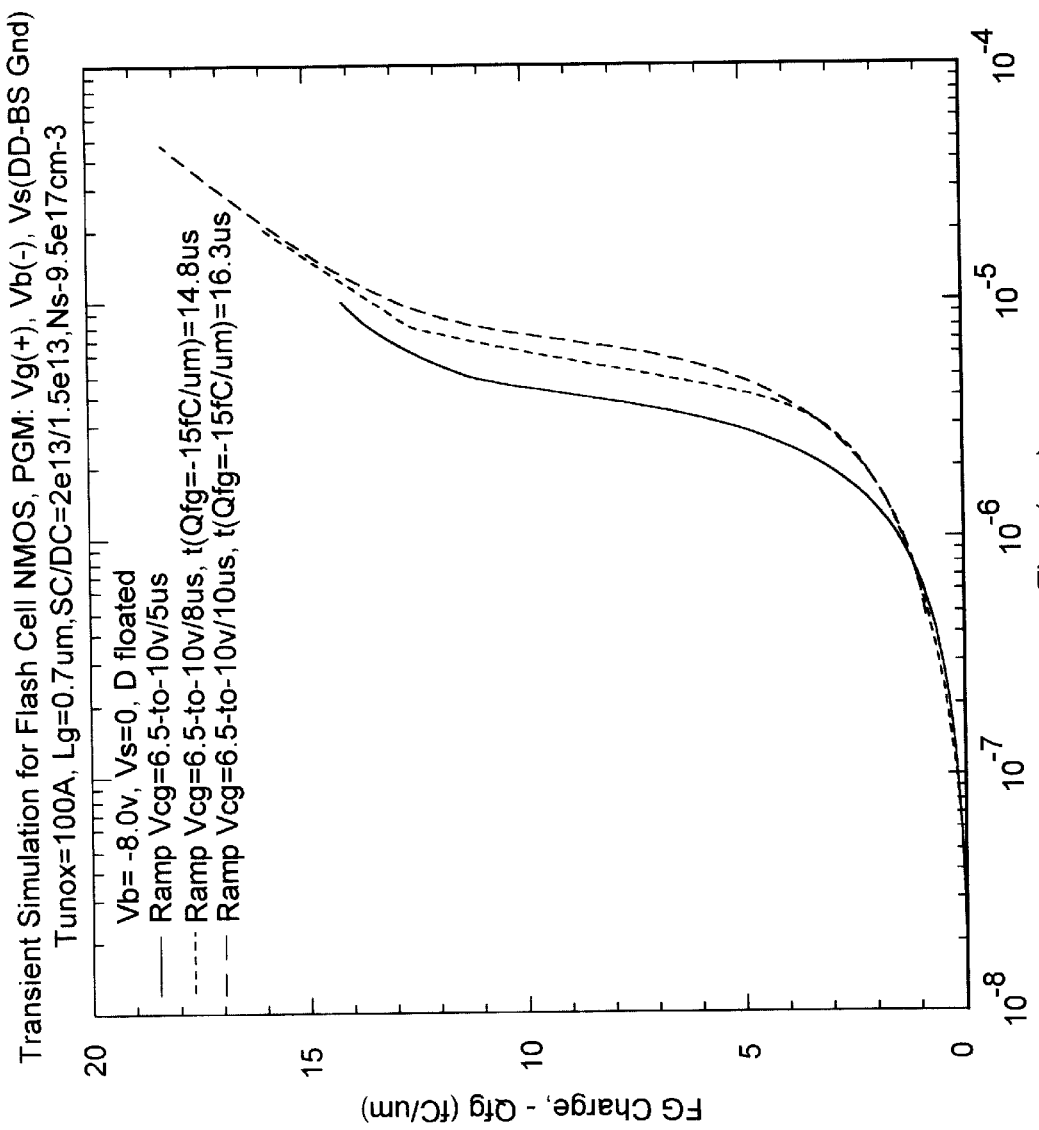
FIG. 10C is a graph of the floating gate charge versus time simulation for a flash cell with substrate bias of −8 volts and control gate voltage ramping interval of 5 microseconds, 8 microseconds and 10 microseconds.
Figure 11:
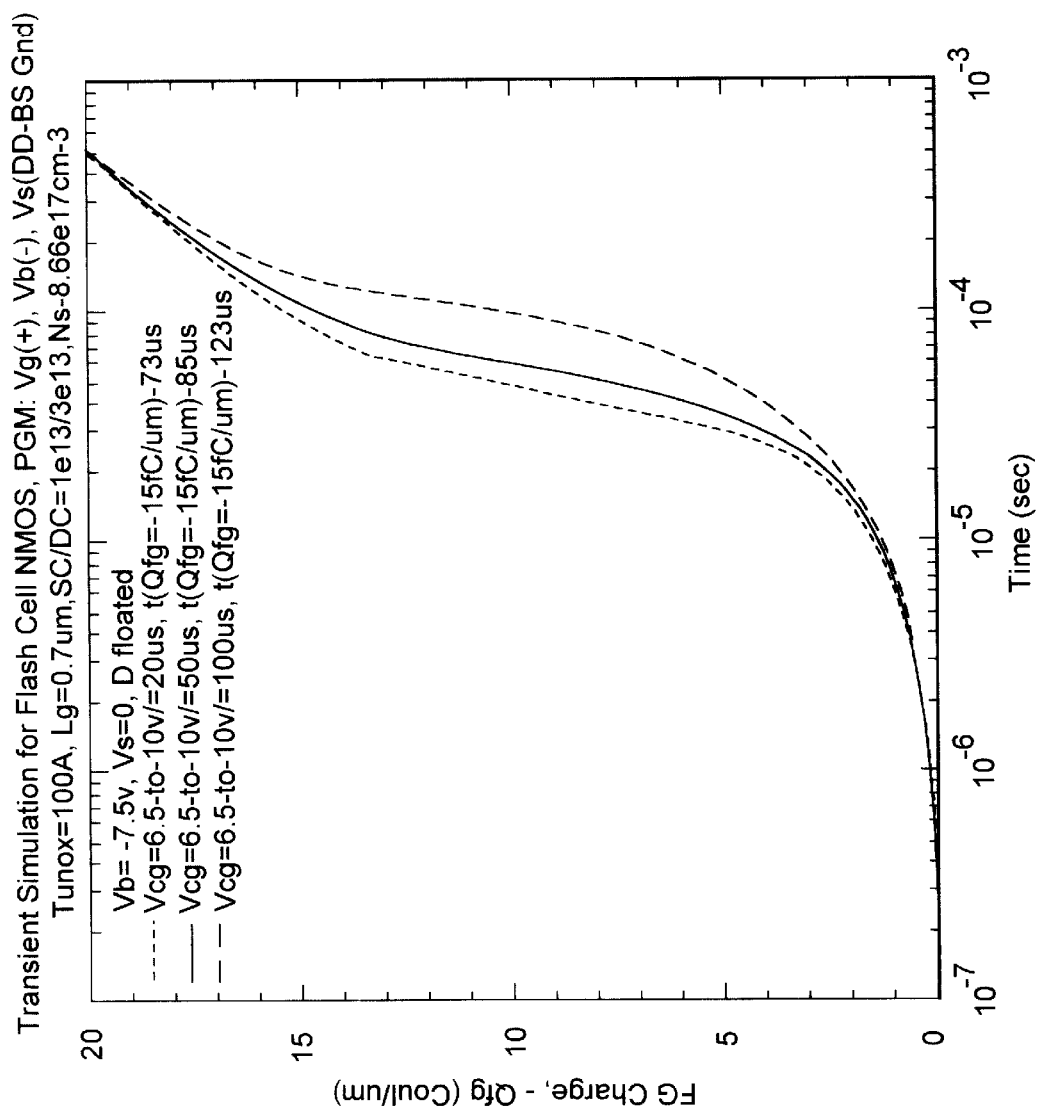
FIG. 11 illustrates program transient characteristics for flash cell having different doping concentrations than simulated in FIGS. 10A–10C.

FIGS. 10A, 10B and 10C illustrate the PGM transient characteristics calculated by simulation for cell device with SC2e13DC1.5e13 (shallow cell SC/deep cell DC doses=2× $10^{13}/cm^2$ and $1.5\times 10^{13}/cm^2$). Negative substrate biases of −7v, −7.5v, and −8v are applied for FIGS. 10A, 10B and 10C respectively. Positive gate biases applied to control-gate are ramped from 6.5v to 10v ($V_{CG}$=6.5v ramped to 10v). The ramp times are varied according to the magnitude of negative substrate bias ($|V_B|$). The higher $|V_B|$, the larger $I_G$ and the faster PGM speed, so that smaller ramp time is needed. The optimized ramp time is specified to keep $I_G$ and $I_D$ constant during ramping. For another set of cell implant conditions : SC1e13DC3e13, the PGM transient characteristics with various ramp rate are depicted in FIG. 11. The PGM time is defined as the time required to achieve floating-gate charge of 15 fC/um, i.e. $Q_{FG}$=−15 fC/um, and $I_{BBT,\ MAX}$ the maximum drain leakage current during ramping. PGM time and $I_{BBT,\ MAX}$ for all split cell implant conditions with various bias conditions and ramp rates are summarized in TABLE 3.

TABLE 3

| Cell Implants | PGM Bias Conditions | | PGM Time | $I_{BBT,MAX}$ |
| --- | --- | --- | --- | --- |
| | $V_B$ | Ramp $V_{CG}$ | $Q_{FG}$ = −15 fC/um | (nA/um) |
| SC2e13.DC1.5e13 | −7.0 v | 6.5~10 v/50 us | 83 us | 25 |
| | | 6.5~10 v/100 us | 110 us | 19.5 |
| | −7.5 v | 7.0~10 v/5 us | 29 us | 100 |
| | | 7.0~10 v/10 us | 30 us | 90 |
| | −8.0 v | 6.5~10 v/5 us | — | 4700 |
| | | 6.5~10 v/8 us | 14.8 us | 960 |
| | | 6.5~10 v/10 us | 16.3 us | 310 |
| SC1.5e13.DC1.5e13 | −8.0 | 6.5~10 v/100 us | 680 us | 3.4 |
| SC1e13.DC3e13 | −8.0 | 6.5~10 v/20 us | — | short ($|V_B|$ >$V_{BD}$) |
| | −7.5 | 6.5~10 v/20 us | 73 us | 30 |
| | −7.5 | 6.5~10 v/50 us | 85 us | 26 |
| | −7.5 | 6.5~10 v/100 us | 123 us | 21.7 |

<Notation>
SC: Shallow Cell Implant
DC: Deep Cell Implant
$V_G$ and $V_B$: Control-gate and substrate biases
$V_{BD}$: Gate-aided Drain-to-Substrate junction breakdown voltage
$Q_{FG}$: Charge density stored in Floating-Gate (FG)
$I_{BBT,MAX}$: Maximum BBT current, i.e. maximum off-state drain leakage current.

Figure 12A:
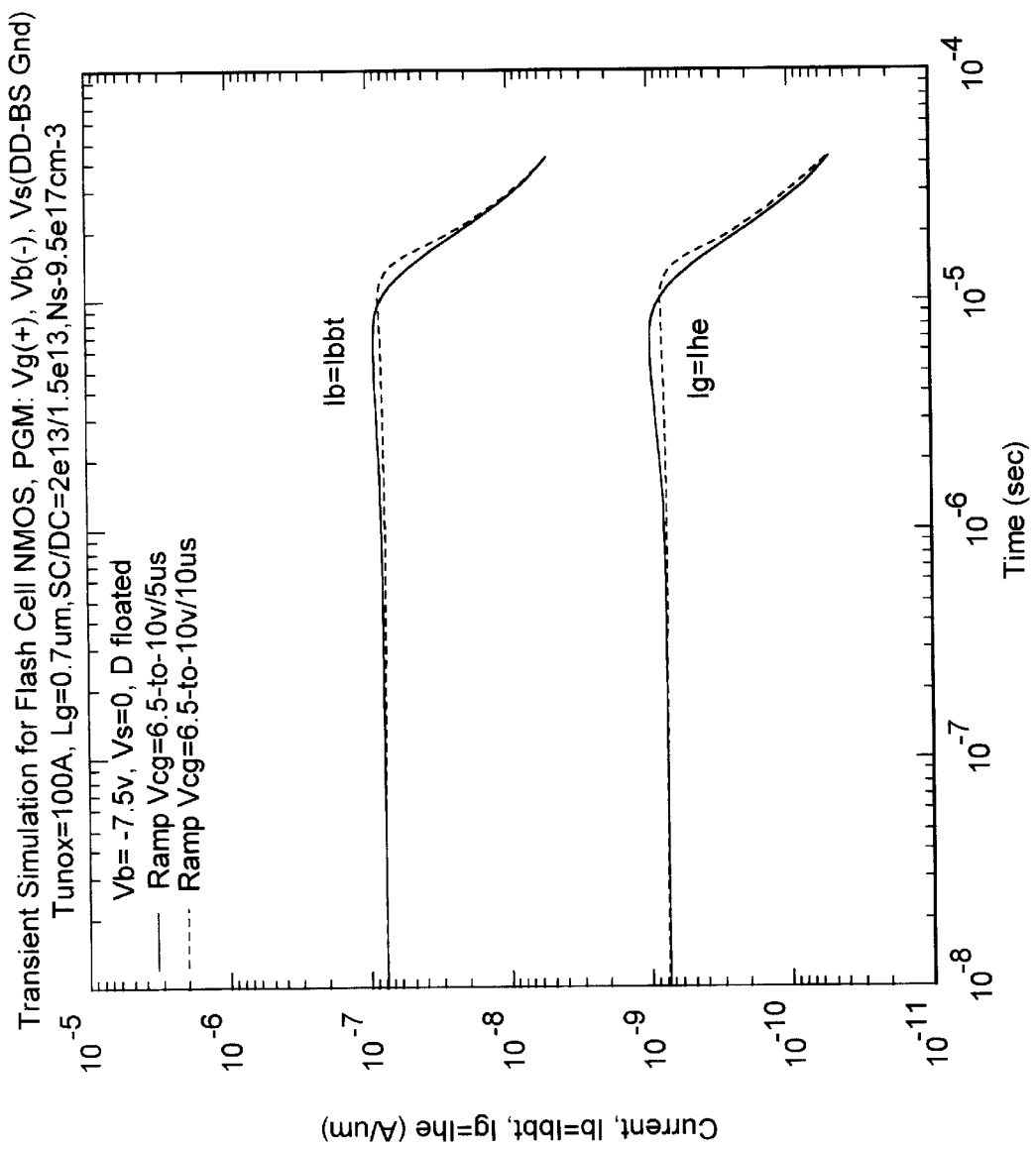
FIG. 12A is a graph of band-to-band tunneling current and gate voltage versus time for a first simulation of a cell according to the present invention.
Figure 12B:
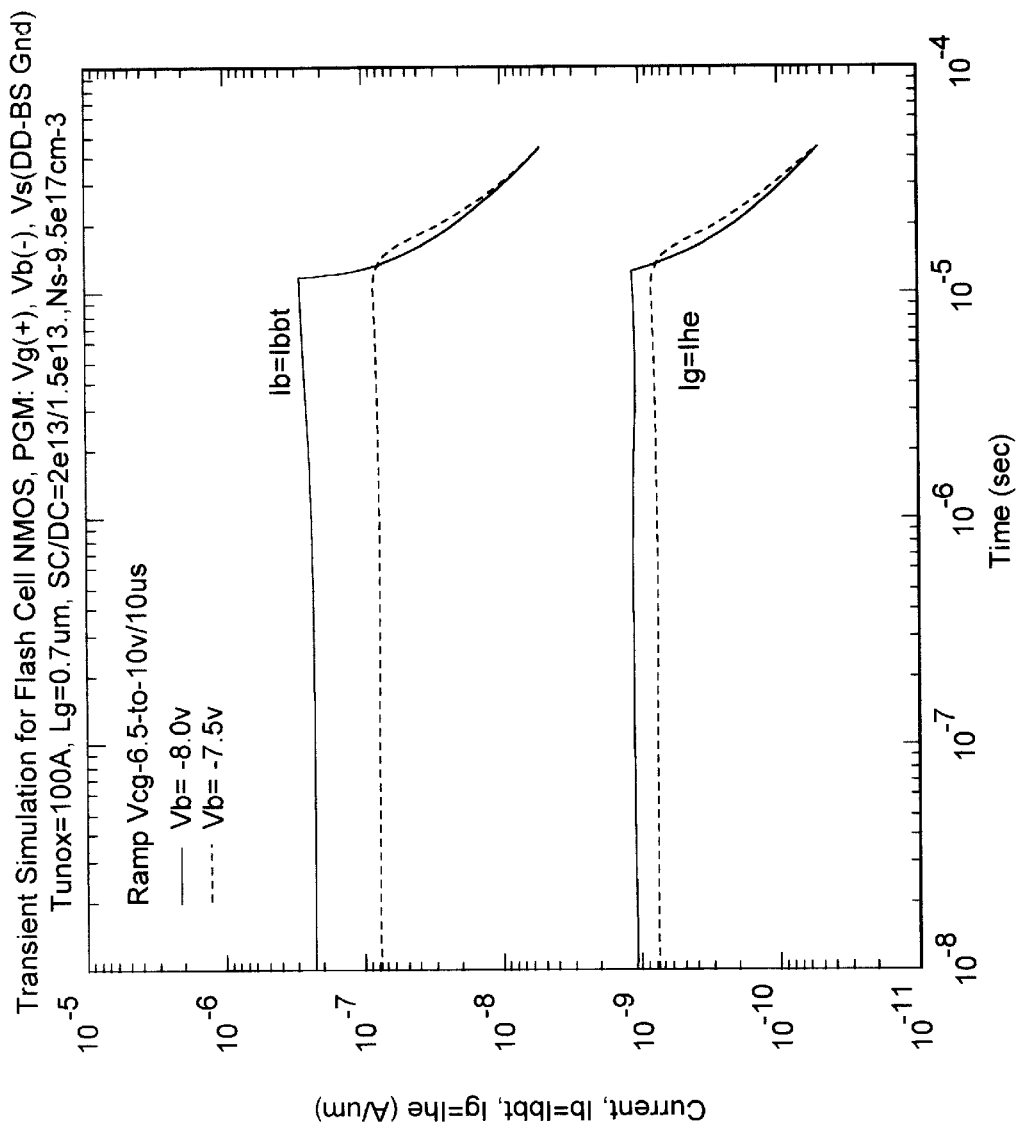
FIG. 12B is a graph of band-to-band tunneling current and gate voltage versus time for a second simulation of a cell according to the present invention.
Figure 12C:
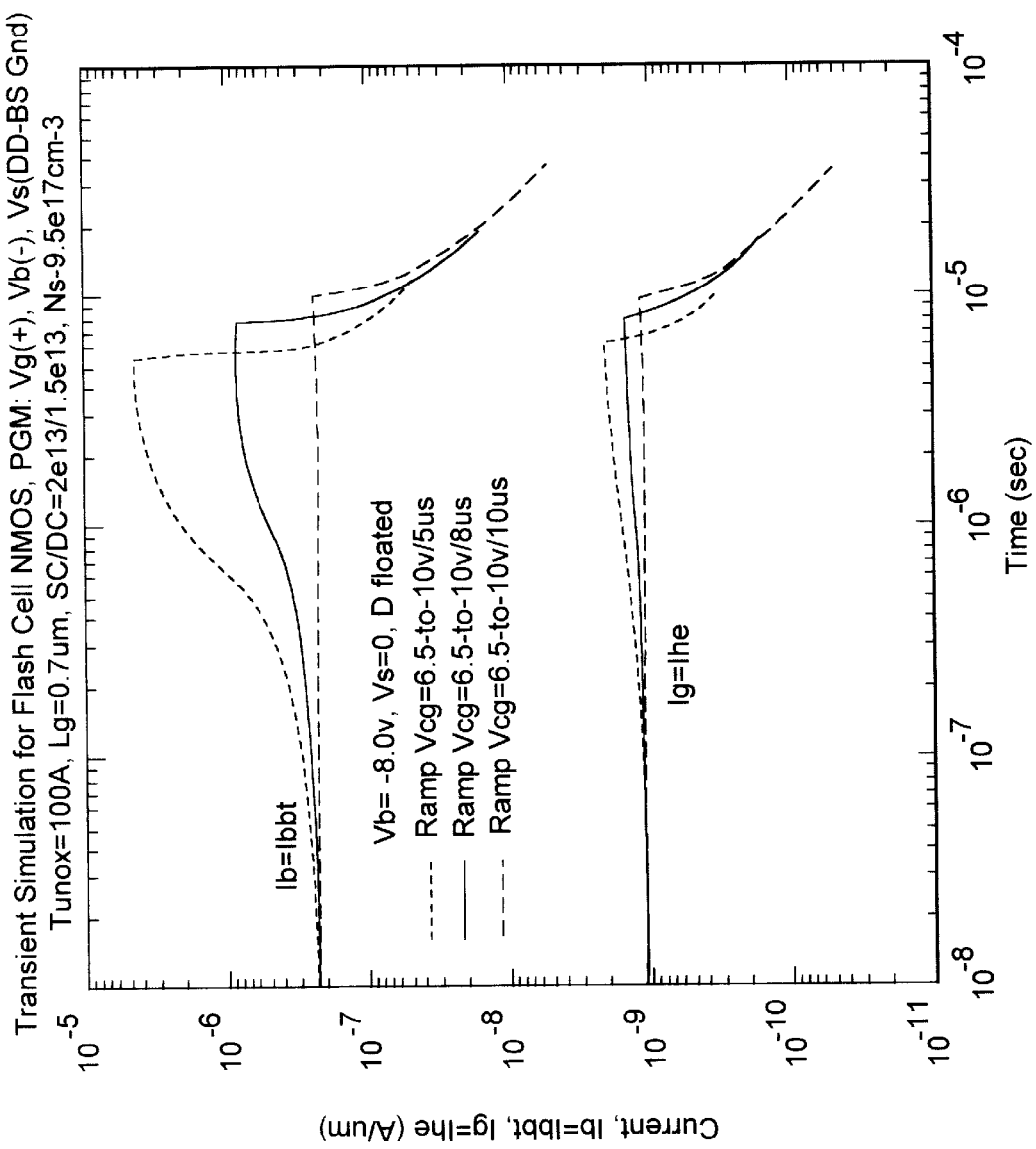
FIG. 12C is a graph of band-to-band tunneling current and gate voltage versus time for a third simulation of a cell according to the present invention.
Figure 13:
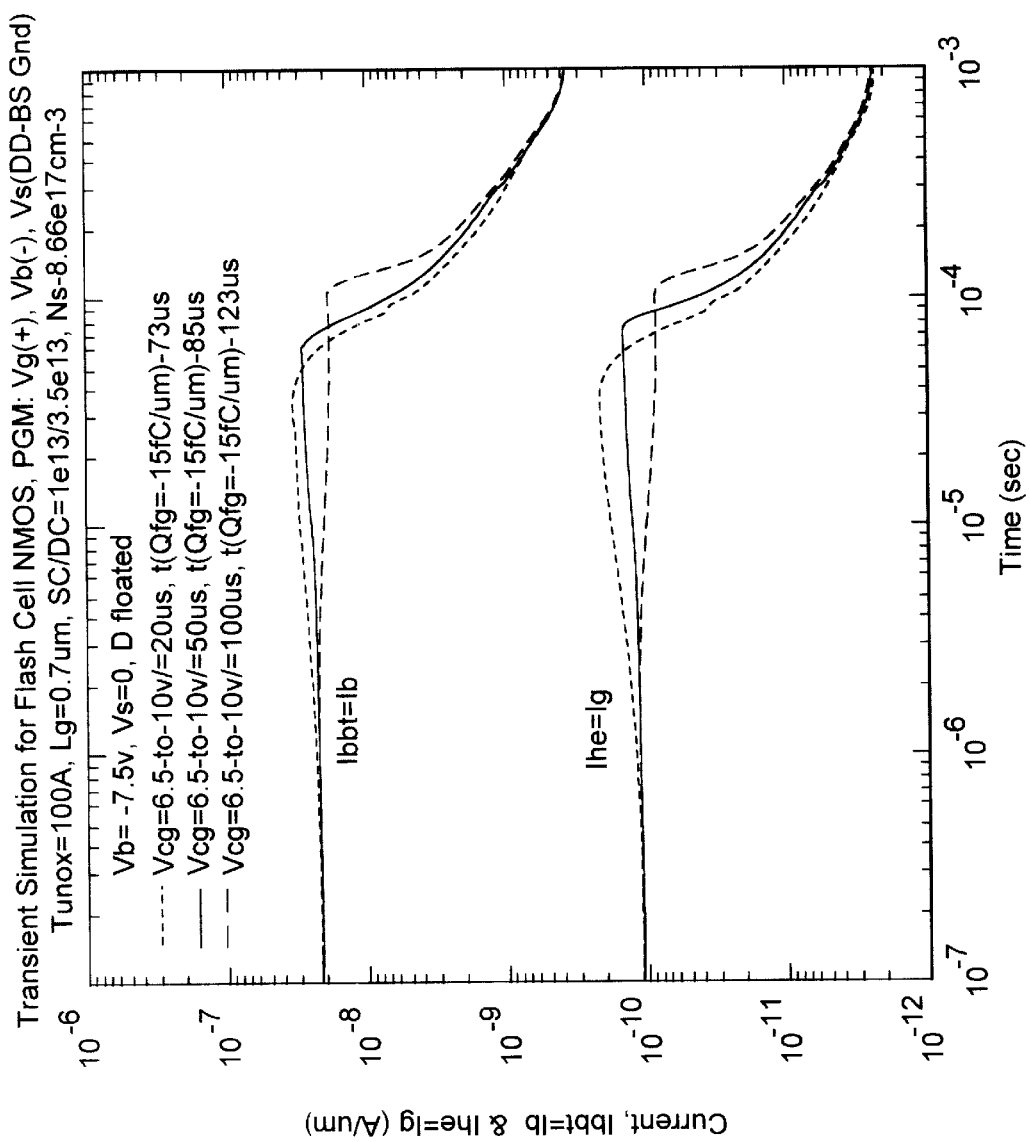
FIG. 13 is a graph of another transient simulation of band-to-band tunneling current and gate voltage versus time for a flash cell implemented according to the present invention.

FIGS. 12A, 12B and 12C illustrate the $I_D$ and $I_G$ characteristics during PGM calculated by simulation for cell device with SC2e13DC1.5e13. The bias schemes have been described for FIGS. 10A–10C. Obviously, for $V_B$=−8v the optimized ramp time is about 10 us to $I_D$ and $I_G$ from overshoot during ramping $V_{CG}$. FIG. 13 demonstrates the result for SC1e13DC3e13 with $V_B$=−7.5v. The optimized ramp time is about 20~50 us. In TABLE 4, $I_D$=$I_{BBT}$, $I_G$=$I_{HE}$, and gate injection ratio are summarized for several sets of cell implant conditions. The calculated gate injection ratios range from about 0.5 to $1\times10^{-2}$ that is consistent with measured result shown in FIG. 9.

TABLE 4

| SC | DC | $N_S$ | $V_{BD}$ ($V_P = 0$) | | $V_P = -6$ v, $V_P = 4$ v, $V_D = 0$ | | | $V_P = -6$ v, $V_P = 4$ v, $V_D = 0$ | | |
|---|---|---|---|---|---|---|---|---|---|---|
| | | | | | | | $I_{HE}/I_{BBT}$ | | | $I_{HE}/I_{BBT}$ |
| (cm$^{-2}$) | (cm$^{-2}$) | (cm$^{-3}$) | N+ VD P-sub | $V_B$ | $I_{BBT}$ | $I_{HE}$ | (%) | $I_{BBT}$ | $I_{HE}$ | (%) |
| $1.5 \times 10^{13}$ | $1.5 \times 10^{13}$ | $7.64 \times 10^{17}$ | 7.0 v | $-8.1$ v | $1.1.10^{-10}$ | $7.52 \times 10^{-13}$ | 0.684 | $5.5 \times 10^{-10}$ | $4.13 \times 10^{-12}$ | 0.745 |
| $2.0 \times 10^{13}$ | $1.5 \times 10^{13}$ | $9.46 \times 10^{17}$ | 6.5 v | $-7.7$ v | $3.57 \times 10^{-9}$ | $3.05 \times 10^{1-}$ | 0.854 | $1.85 \times 10^{-8}$ | $1.69 \times 10^{-10}$ | 0.914 |
| $1.0 \times 10^{13}$ | $3.0 \times 10^{13}$ | $8.66 \times 10^{17}$ | 6.7 v | $-7.6$ v | $1.27 \times 10^{-9}$ | $1.0 \times 10^{-11}$ | 0.787 | $7.68 \times 10^{-9}$ | $6.5 \times 10^{-10}$ | 0.845 |

| SC | DC | $N_S$ | $V_{BD}$ ($V_P = 0$, D flt) | | $V_P = -7$ v, $V_P = 4$ v, $V_D = 0$ | | | $V_P = -8$ v, $V_P = 4$ v, $V_D = 0$ | | |
|---|---|---|---|---|---|---|---|---|---|---|
| | | | | | | | $I_{HE}/I_{BBT}$ | | | $I_{HE}/I_{BBT}$ |
| (cm$^{-2}$) | (cm$^{-2}$) | (cm$^{-3}$) | DDV$_S$ P-sub | $V_B$ | $I_{BBT}$ | $I_{HE}$ | (%) | $I_{BBT}$ | $I_{HE}$ | (%) |
| $1.5 \times 10^{13}$ | $1.5 \times 10^{13}$ | $7.64 \times 10^{17}$ | 8.5 v | | $5.5 \times 10^{-10}$ | $4.13 \times 10^{-12}$ | 0.745 | $2.9 \times 10^{-9}$ | $1.92 \times 10^{-11}$ | 0.662 |
| $2.0 \times 10^{13}$ | $1.5 \times 10^{13}$ | $9.46 \times 10^{17}$ | 8.2 v | | $1.85 \times 10^{-8}$ | $1.69 \times 10^{-10}$ | 0.914 | $2.37 \times 10^{-7}$ | $1.13 \times 10^{-9}$ | 0.477 |
| $1.0 \times 10^{13}$ | $3.0 \times 10^{13}$ | $8.66 \times 10^{17}$ | 8.25 v | | | | | | | |

<Notation>
$I_{BBT}$: Maximum BBT current, i.e. off-state leakage current
$I_{HE}$: BBT induced hot-electron-injection current
$N_S$: Cell channel surface doping concentration
$N^+V_D$: Drain bias applied to the abrupt N+ drain diffusion region
$DDV_S$: Source bias applied to the double-diffused source region A p-type alternative is based on p-channel cell devices in which reverse bias is applied to P source or drain region. BBT occurs due to the severe band bending aided by negative bias applied to P source or drain and positive bias to the gate. It is well recognized that BBT leads to generation of electron-hole pairs and the drain-to-substrate leakage current named GIDL (Gate-Induced-Drain-Leakage). GIDL of the p-channel device is contributed from the hole current drifted by the negatively biased drain while the electrons left may be injected to the gate which is positively biased. Such a mechanism responsible for the gate current is called BBT induced hot electron injection (BBT-HEI). In summary, BBT-HEI occurs not only in n-channel but also in p-channel devices. It is noted here that source/drain doping profile is generally modeled by a Gaussian function with a diffusion tail in which concentration level in the order of $1 \times 10^{18}$ to $1 \times 10^{19} \text{cm}^{-3}$ must be encountered.

Accordingly, a novel electron injection scheme is provided for flash memory cell devices. Substrate band-to-band tunneling BBT induced hot electron injection is employed to realize low current, low power, high speed and hot hole injection free programming operation. A programming speed of around 10 to 15 microseconds per byte or less can be achieved with ultra low leakage current of less than one microAmp per byte. Thus, the present invention enables ultra high programming speed of for example 15 nanoseconds per byte with a whole chip leakage current of less than one milliamp when utilizing one kilobyte parallel programming. A gate bias of no larger than 10 volts, 0 drain bias, and a reverse substrate bias of less than the junction breakdown voltage is employed as the bias configuration for this new scheme. Because of the small voltage drop across the oxide required for this new programming scheme, the stress on the oxide is greatly relieved compared to prior art approaches. Furthermore, the reliability problems arising from stress induced oxide traps in the tunneling oxide of the prior art approaches is resolved automatically. Moreover, the reverse substrate bias utilized for this new scheme not only prohibits hot hole injection but also enhances hot electron injection efficiency. Thus, a highly reliable cell with very high programming speed is achieved.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A floating gate memory device, comprising:
   a semiconductor body having a first concentration of a first type of dopant;
   a source in the semiconductor body having a first concentration of a second type of dopant;
   a drain in the semiconductor body having a second concentration of the second type of dopant;
   a channel in the semiconductor body between the source and the drain, wherein the channel includes a concentration of the first type dopant in a range of about $1 \times 10^{18}/\text{cm}^3$ or higher near a surface of the channel; and
   bias circuits to induce band-to-band tunneling current from the semiconductor body to one of the drain and source near the channel, to apply a negative bias to the semiconductor body less than a junction breakdown voltage of a junction between the one of the source and drain and the channel and to apply a positive bias voltage to the control gate to induce hot electron injection into the floating gate.

2. The floating gate transistor of claim 1, wherein the semiconductor body comprises a well having the first concentration of the first type of dopant, the well within a deeper well having a concentration of the second type of dopant in a semiconductor substrate having a concentration of the first type of dopant.

3. The floating gate memory device of claim 1, wherein the semiconductor body comprises a semiconductor material on a semiconductor substrate, and an isolation structure between the semiconductor material and the semiconductor substrate.

4. The floating gate memory device of claim 1, wherein the first type of dopant comprises p-type dopant, and the second type of dopant comprises n-type dopant.

5. The floating gate memory device of claim 1, wherein the semiconductor body comprises silicon.

6. The floating gate memory device of claim 1, wherein the concentration of the first type dopant in the channel falls in a range of about $1\times10^{18}/cm^3$ or higher within about 0.2 microns of the surface of the channel.

7. The floating gate memory device of claim 1, wherein the concentration of the first type dopant in the channel falls in a range of about $1\times10^{18}/cm^3$ or higher near a surface of the channel and is established by a shallow implant of dopants having a concentration on the order of $10^{13}cm^2$ at an energy between about 70 keV and 40 keV in combination with a deeper implant of dopants having a concentration on the order of $10^{13}/cm^2$ at an energy between about 100 keV and 150 keV.

8. The floating gate memory device of claim 1, wherein the bias circuits include circuits floating the other of the source and drain to prevent source to drain current through the channel.

9. The floating gate memory device of claim 1, wherein the bias circuits include circuits applying a reference potential to the one of the source and drain sufficient to establish conditions for the band-to-band tunneling current.

10. The floating gate memory device of claim 9, wherein the bias circuits include circuits applying a reference potential of approximately 0 volts to the drain.

11. The floating gate memory device of claim 9, wherein the bias circuits include circuits applying a reference potential of approximately 0 volts to the drain; and circuits applying a negative bias of about negative 4 volts to negative 8 volts to the semiconductor body.

12. The floating gate memory device of claim 9, wherein the bias circuits include circuits applying a reference potential of approximately 0 volts to the drain, and applying a negative bias of about negative 4 volts to negative 6 volts to the semiconductor body; and wherein the positive bias voltage applied to the control gate falls in a range of about positive 6 volts to about positive 10 volts.

13. The floating gate memory device of claim 1, wherein the current through the one of the source and drain falls in a range of about 1 to 10 nanoAmperes during band-to-band tunneling current.

14. The floating gate memory device of claim 1, wherein hot electron injection current induced is about 0.5 to 1 percent of the band-to-band tunneling current.

15. The floating gate memory device of claim 1, wherein the bias circuits include circuits ramping the positive bias voltage applied to the control gate during an interval of 5 to 100 microseconds from an initial level to a final level.

* * * * *